(12) United States Patent
Inoue

(10) Patent No.: US 6,803,793 B2
(45) Date of Patent: Oct. 12, 2004

(54) REDUCED SWING CHARGE RECYCLING CIRCUIT ARRANGEMENT AND ADDER INCLUDING THE SAME

(75) Inventor: Atsuki Inoue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 16 days.

(21) Appl. No.: 10/061,379

(22) Filed: Feb. 1, 2002

(65) Prior Publication Data

US 2002/0109530 A1 Aug. 15, 2002

Related U.S. Application Data

(60) Provisional application No. 60/265,989, filed on Feb. 2, 2001.

(51) Int. Cl.[7] ............................................. H03K 19/096
(52) U.S. Cl. .............................. 326/95; 326/55; 326/93; 326/113
(58) Field of Search ............................. 326/93, 83, 54, 326/55, 106, 108, 113, 95; 327/407

(56) References Cited

U.S. PATENT DOCUMENTS 5,206,544 A    4/1993  Chen et al.
5,254,883 A   10/1993  Horowitz et al.
5,325,328 A *  6/1994  Muroya et al. ......... 365/189.05
5,680,366 A * 10/1997  Kotani et al. .......... 365/230.06
5,859,548 A    1/1999  Kong
5,903,169 A    5/1999  Kong
5,907,251 A    5/1999  Houghton
6,016,065 A    1/2000  Kong
6,028,453 A    2/2000  Kong
6,097,220 A    8/2000  Huang
6,337,582 B1 *  1/2002  Yoshioka ...................... 326/83

* cited by examiner

Primary Examiner—Daniel D. Chang
(74) Attorney, Agent, or Firm—Christie, Parker & Hale, LLP

(57) ABSTRACT

A circuit arrangement uses differential pass transistor logic, a low voltage swing and charge recycling to save power, in which the swing voltage is reduced, but the supply voltage is not reduced, thereby maintaining the transistor device current and avoiding speed degradation. SOI devices including an adder, which uses this circuit arrangement, can avoid the body effect to long pass transistor network and improve the speed at lower supply voltage.

8 Claims, 17 Drawing Sheets

(a) Type 1 Driver     (b) Type 2 Driver     (c) Waveform

FIG.1 PRIOR ART

| Concept | Conventional | Low swing signaling |
|---|---|---|
| | (circuit diagram with inputs A, B, $\bar{B}$, $\bar{C}$, output OUT, $V_{dd}$) | (circuit diagram with inputs $\bar{A}$, A, B, output OUT, $V_{dd} - V_{th}$, C) |
| Power | $CV_{dd}^2 f$ | > $CV_{dd}V_s f$ |
| Delay | $CV_{dd}/(V_{dd}-V_{th})^\alpha$ | = $CV_{dd}/(V_{dd}-V_{th})^\alpha$ |

(a) Type 1 Driver
(b) Type 2 Driver
(c) Waveform

REDUCED SWING CHARGE RECYCLING CIRCUIT ARRANGEMENT AND ADDER INCLUDING THE SAME

CROSS REFERENCE TO RELATED APPLICATIONS

This application claims the benefit of U.S. provisional application number 60/265,989 filed Feb. 2, 2001, which is incorporated by reference as if set forth in full herein.

BACKGROUND OF THE INVENTION

1. Field of the Invention

The present invention generally relates to a low power CMOS circuit, and particularly a low-power SOI device.

2. Description of the Related Art

Power reduction is important in modern VLSI design due to the increasing operating frequencies and circuit densities, and the emergence of new mobile applications such as portable terminals and consumer products. CMOS is one of the most low power logic styles because the circuits consume power only when the logic states change and it is widely used in the modern LSI. However, as the technology is scaling and the number of the transistors is increasing, the dynamic power consumption is increasing rapidly. Decreasing the supply voltage is the easiest way to reduce power consumption in CMOS circuits because switching power is proportional to the square of the supply voltage.

However, reducing the supply voltage degrades circuit speed due to the super-linear reduction of transistor current. The voltage applied to transistor gate determines transistor conductance and larger conductance can charge up the output node faster. So if the supply voltage is reduced, the voltage applied to the gate is also reduced and thus significantly degrade the circuit speed. To recover this slow down, the reduction of threshold voltage of the transistor is effective.

However, the reduction of the threshold voltage leads to increasing sub-threshold leakage current and the leakage current increases the stand-by power consumption of LSI, which is not acceptable for the application of consumer products such as a portable terminal powered from a battery. Recently, since the threshold voltage of the transistor may be selected so as to be rather low, a further reduction of the threshold voltage may be difficult.

Another technique for lowering power consumption without reducing the supply voltage is to lower a swing voltage. In conventional low swing voltage circuits, dynamic low swing drivers are used and during the evaluation of the logic, at least one of the net or signal becomes floating. In the design of the data path, this net usually becomes long and a lot of other nets go over the net. A coupling noise to these nets easily causes failure of slow down of the circuits.

SUMMARY OF THE INVENTION

Accordingly, it is an object of the present invention to provide a new low power CMOS circuit, in which the supply voltage and/or the threshold voltage is not reduced, and power reduction can be achieved without the cost of degrading the circuit speed.

It is another and more specific object of the present invention to provide an SOI device utilizing the low-power CMOS circuit.

In order to achieve the above objects according to the present invention, a circuit is proposed, in which the supply voltage is not reduced, but only swing voltage is reduced. As the power consumption is proportional to the swing voltage, dynamic power reduction is expected by reducing the swing voltage. Since the supply voltage is not reduced, the voltage applied to the gate is not reduced and the circuit speed is maintained. The charge recycling scheme is also applied to the circuits. In typical CMOS circuits, all the charge stored at the output node is dumped to ground when the logic state changes. A charge recycling circuit can re-use the charge stored in the previous cycle and can reduce the power consumption by half.

The circuit according to the present invention has a configuration using both reduced swing voltage and charge recycling techniques. This scheme is called Low Swing Charge Recycling (LSCR) style.

In order to achieve the above object, a circuit arrangement is disclosed, which includes:

a complementary pass transistor logic;

a static driver connected to the complementary pass transistor logic and driving complementary input nodes to each other of the complementary pass transistor logic by a low swing voltage; and a charge recycling circuit connected to the complementary pass transistor logic and performing charge sharing between the complementary input nodes when the complementary pass transistor logic is not driven by the static driver.

According to the present invention, since the static driver can reduce the swing voltage while maintaining the supply voltage and the charge recycling circuit can reduce the charge provided from the supply by half, the circuit can lower the power consumption without being suffered from circuit speed degradation. Furthermore, since the driver of the present invention is static, all nets or signals stay static during evaluation of the logic. In other word, all the nets have a path to the supply or the ground during evaluation and they are robust against coupling from other nets.

With the above-described circuit arrangement, a swing level of the low swing voltage ranges from a ground voltage level to a supply voltage level minus a threshold voltage level.

Moreover, with the above-described circuit arrangement, the static driver is formed of a plurality of transistors connected in series In order to achieve the object, a low swing charge recycling circuit arrangement is disclosed, which includes:

a complementary pass gate stage having driving inputs to receive each of driving input signals, having complementary outputs to produce an output signal on one hand and a complementary-output signal on the other and determining a logic operation of the circuit arrangement;

a static low swing driver stage having a signal input to receive an input signal, having a clock input to receive a clock signal, and having complementary outputs to produce low swing complementary signals to each output to be provided to the driving inputs of the complementary pass gate when the clock signal is in one of two states; and an equalization stage being connected to the complementary outputs, having a clock input to receive the clock signal and producing complementary signals to the driving inputs of the complementary pass gate stage when the clock signal is in the other state, whereby a charge shared signal of an intermediate voltage level between those of the complementary outputs is shared between the driving inputs.

With the above-described circuit arrangement, the static low swing driver stage is operated to reduce a swing voltage applied to a source of the complementary pass gate stage without changing the supply, voltage, so that the power consumption can be saved. Since the level of the driving input signals to the pass gate stage for logic operation does not have to be lowered, the circuit speed can be maintained without degrading a driving performance for the transistor. When the static low swing driver stage is not operated the complementary outputs of the drive are closed, the equalization stage is alternatively operated and allows the charge sharing between the driving inputs of the pass gate stage, and thus resulting in the power consumption reduction. The equalization stage performs the charge sharing between the complementary driving inputs by connecting the driving inputs and pre-charges both driving inputs to a certain intermediate voltage between a driving voltage level and a ground level. This allows an effective logic signal swing to be approximately a half of that of the circuit without charge recycling and results in low power consumption.

With the above-described circuit arrangement, the driver stage is designed to be static. As a result, the drive stage is operated such that all the nodes are driven by the supply potential or ground potential during the evaluation, and thus the driver stage has no floating nodes. Therefore, the circuit arrangement will not be likely to cause malfunction nor signal delay.

It may be particularly advantageous that the above-mentioned low swing charge recycling circuit arrangement is applied to an SOI device. The SOI transistor is fabricated on insulator and has less parasitic capacitance. This is a good feature for achieving low power, because the excessive parasitic capacitance do not need to charge/discharge. The body of these devices is isolated from each other and cannot be contacted with common node without any area penalty. Then the device is usually used as body floating. A floating body device has less body effect than body contacted device or ordinary bulk device and shows higher switching speed, because the body voltage follows the gate voltage during turning the transistor on. Pass transistor gates and stacked transistors get a great benefit from this feature.

However, the floating body voltage fluctuates during the circuit operation and causes "history" effect. The time constant of this phenomenon is enough larger than usual cycle time in the circuit and the body voltage changes every cycle, which brings the delay fluctuation in the circuit.

In contrast, with the circuit arrangement according to the present invention, both the source and drain nodes of the pass transistors are always, precharged, or equalized, to certain voltages and body voltage also can be set at the similar voltage before operation. This feature can suppress body effect. Floating body still gives the speed benefit due to less body effect. Thus, the inventive circuit arrangement is more suitable for SOI devices.

In order to achieve another object of the present invention, an SOI adder formed by a low swing charge recycling circuit arrangement is disclosed. The advantages of the adder according to the present invention over the prior art adder with respect to circuit speed and power consumption are illustrated by means of a below simulation.

The adder according to the present invention includes:

a carry propagating circuit for alternatively propagating low swing driven complementary carry input signals and charge sharing complementary carry input signals;

a static low swing driver circuit receiving generate signals and producing low swing driven complementary generate signals;

a pass gate network receiving the complementary carry input signals, the complementary generate signals and propagate signals and being controlled by the propagate signals for producing a sum signal by applying XOR operation to the complementary carry signals with the propagate signals;

an equalization circuit adapted to be operative alternatively with the static low swing driver circuit and providing charge sharing complementary generate signals to the pass gate network; and a latch circuit connected to the pass gate network and latching the produced sum signal.

This adder is provided with the same features as those of the above-described low swing charge recycling circuit arrangement.

Furthermore, it is advantageous to connect this adder in series in order to achieve an adder module with any number of bits.

An adder module according to the present invention includes:

at least one adder connected in series, each adder being provided on the basis of one bit to be added; and a carry input signal equalization circuit receiving carry input signals and providing charge sharing complementary carry input signals to one end of the adders connected in series, wherein the adder includes:

a carry propagating circuit for alternatively propagating low swing driven complementary carry input signals and the charge sharing complementary carry input signals;

a static low swing driver circuit receiving generate signals and producing low swing driven complementary generate signals;

a pass gate network receiving the complementary carry input signals, the complementary generate signals and propagate signals and being controlled by the propagate signals for producing a sum signal by applying XOR operation to the complementary carry signals with the propagate signals;

an equalization circuit adapted to be operative alternatively with the static low swing driver circuit and providing charge sharing complementary generate signals to the pass gate network; and a latch circuit connected to the pass gate network and latching the produced sum signal.

The above-described adder module further includes:

a carry propagating path for propagating the complementary carry input signals in series of bits;

a carry skip path by passing the adders connected in series in order to pass the complementary carry input signals transparently; and a carry conflict-free circuit for protecting a conflict of the propagated carry input signals and the passed carry input signals.

Other objects and further features of the present invention will be apparent from the following detailed description when read in conjunction with the accompanying drawings.

BRIEF DESCRIPTION OF THE DRAWINGS

FIG. 1 illustrates a basic concept of low swing voltage driven technique;

DETAILED DESCRIPTION OF THE PREFERRED EMBODIMENTS

In the following, principles and embodiments of the present invention will be described with reference to the accompanying drawings.

[Overview]

Decreasing the supply voltage, $V_{dd}$, is the easiest way to reduce power consumption in CMOS circuits. However, reducing $V_{dd}$ degrades circuit speed. Lowering transistor threshold voltage helps to recover the speed degradation; however sub-threshold leakage current increases exponentially with threshold voltage. In an embodiment of the present invention, we propose a new circuit technique using differential pass transistor logic, a low voltage swing and charge recycling to save power, In this configuration, we only reduce the swing voltage and do not reduce supply voltage, thereby maintaining the transistor device current and avoiding speed degradation. We evaluated the 32 bit adder using this configuration and confirmed 53% better power-delay product performance compared with ordinary CLA adder. SOI devices can avoid the body effect to long pass transistor network and improve the speed at lower supply voltage.

[Low Swing Voltage drive and Charge Recycling Methods]

Dynamic power consumption in CMOS is proportional to the supply voltage $V_{dd}$ and the swing voltage $V_{sw}$. A typical CMOS circuit is configured such that the swing voltage is equal to the supply voltage. In this case, the dynamic power consumption is proportional to the square of the supply voltage. As the swing voltage is lower than the supply voltage, the power consumption is reduced accordingly.

We will explain the basic concept of the low swing voltage drive, referring to FIG. 1. As shown in FIG. 1, the swing voltage is reduced to $V_{dd}-V_{th}$, where $V_{th}$ represents a threshold voltage of the transistor. Since the supply voltage $V_{dd}$ drives each of transistors, the drive current is not reduced, and thus resulting in low power consumption without circuit speed degradation.

Figure 2:
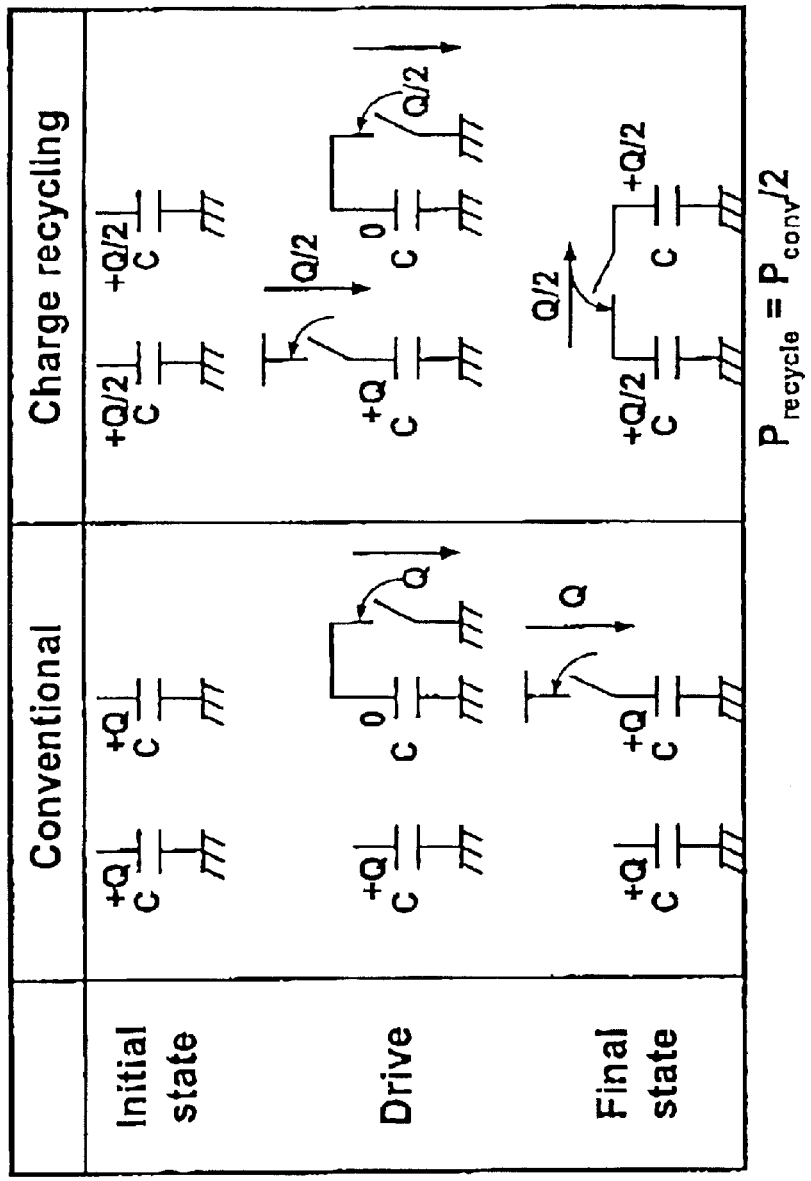
FIG. 2 illustrates a basic concept of charge recycling technique.

Another way to reduce power consumption is to use a charge recycling method. The charge recycling method intends to reduce power consumption by reusing the charge once used. This allows making use of the charge otherwise having been discarded in order to reduce the power consumption. FIG. 2 shows the basic concept of the charge recycling technique in combination with a complementary logic, which is employed in embodiments of the present invention. The left half of FIG. 2 shows the conventional logic without charge recycling, where in an initial state one node and the other node complementary to each other stores charge Q. When the logic is activated, either one of the nodes is grounded so that the charge stored in that node is discharged. As a result, a voltage difference is present between the both nodes and a logic state can be detected. In the final state, the node having lost the charge is provided with the charge Q by the supply such that the node can recover its initial state.

On the contrary, if the charge recycling is used in the logic, the both nodes store the similar charge Q/2 in the initial state. When the logic is activated, one of the both nodes is provided with a further charge Q/2 from the supply, and the other one is grounded so as to pass the charge to the ground. As a result, in a drive state, the both nodes store the same charge as that of the conventional method. In the final state, the both nodes are short circuited in order to recover the both nodes just the same as the initial state. In effect, a switch consumes the power when the switch is conductive after being turn ON. However, as can be seen from FIG. 2, the charge recycling logic reduces the power consumption by half as compared to that of the conventional logic, because the charge to be provided to the charge recycling logic from the supply amounts to just a half of that for the conventional logic.

[Conventional Low Swing Circuited and Inventive Low Swing Charge Recycling Logic]

Figure 3:
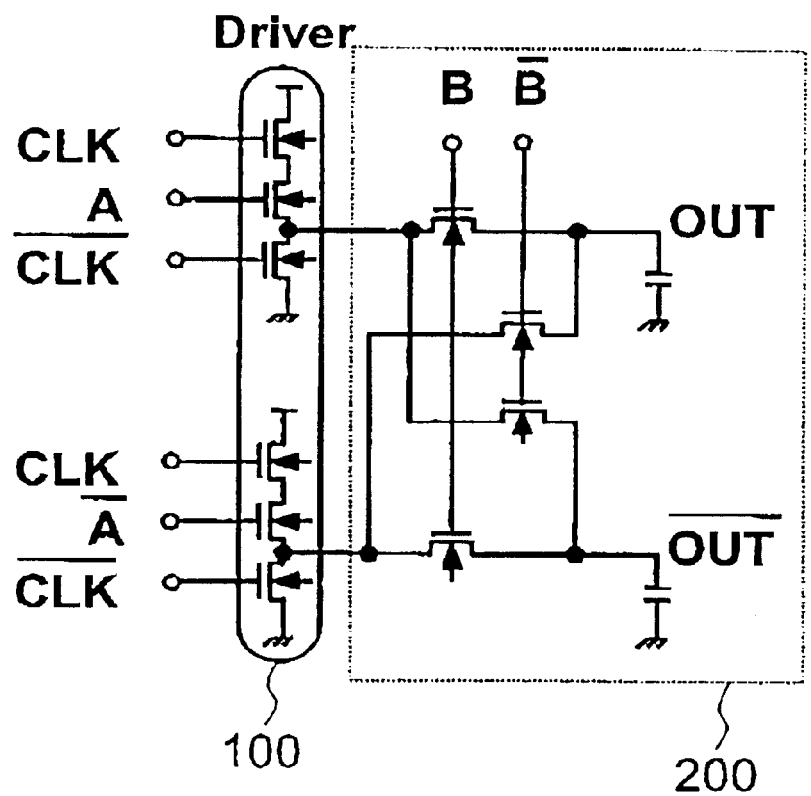
FIG. 3 shows a structure of a conventional XOR gate.
Figure 4:
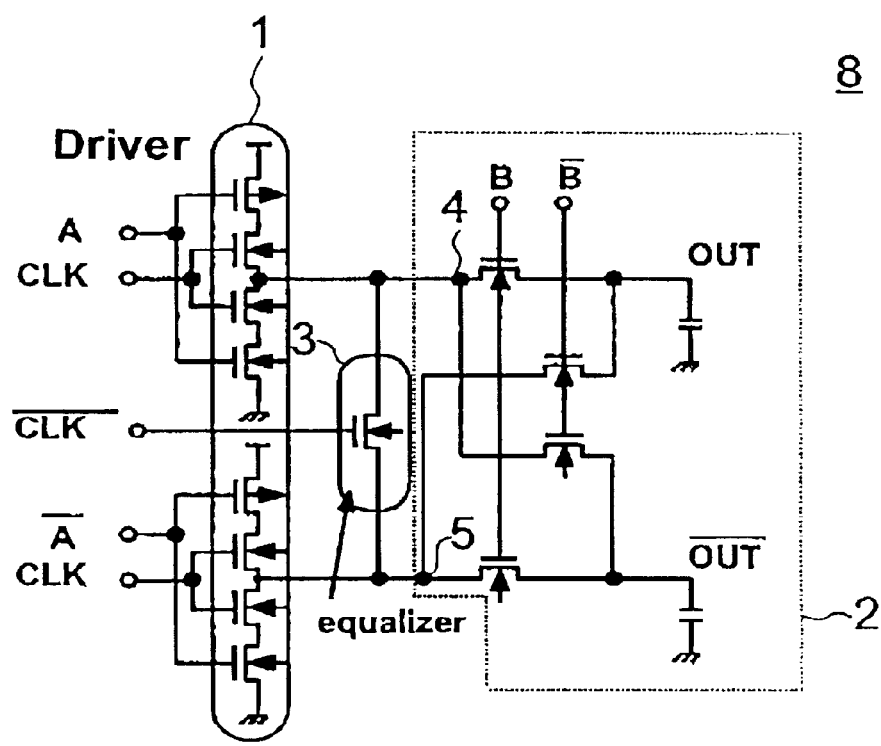
FIG. 4 shows a structure of a low swing charge recycling XOR gate according to an embodiment of the present invention.
Figure 5:
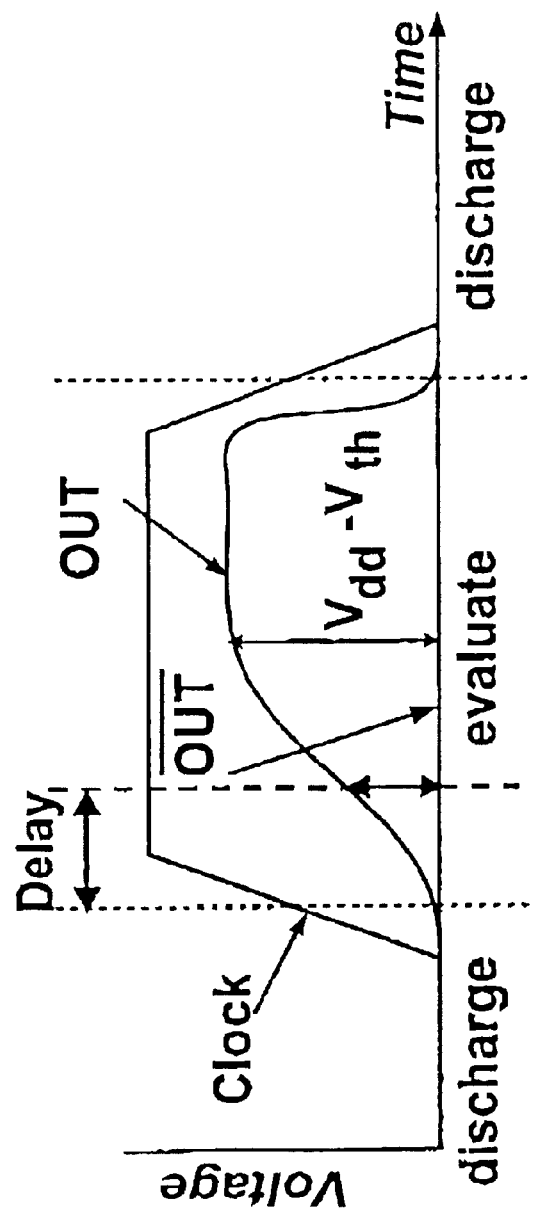
FIG. 5 shows a timing diagram of a conventional LSDD structure.
Figure 6:
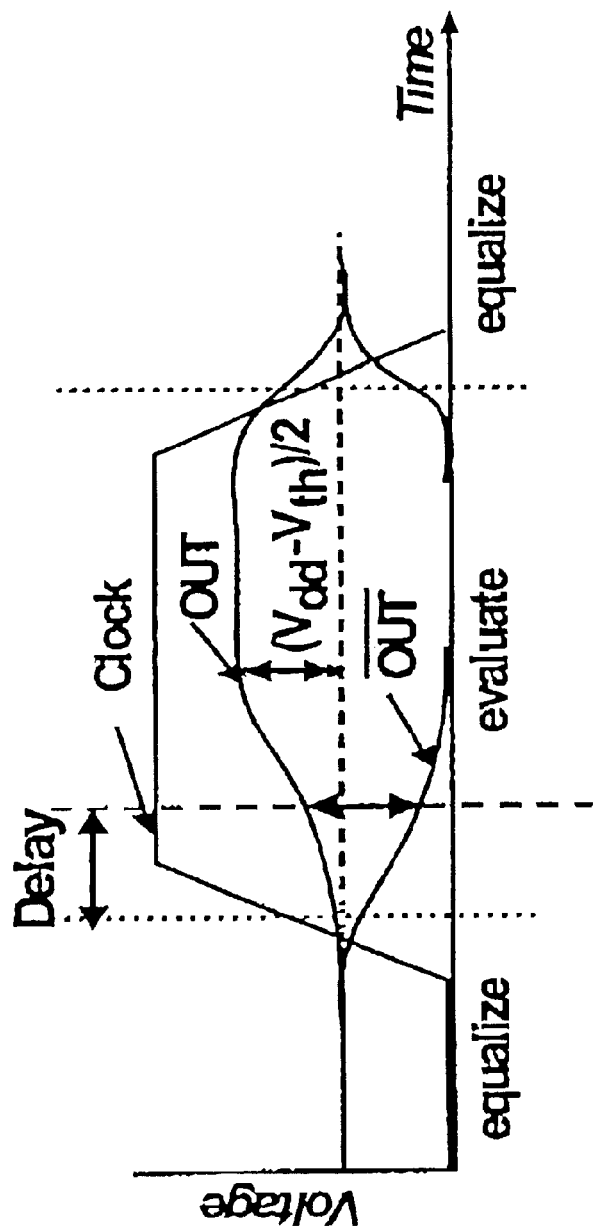
FIG. 6 shows a timing diagram of a low swing charge recycling circuit according to an embodiment of the present invention.

FIG. 3 shows a structure of an XOR gate implemented in the conventional low swing dynamic differential circuit and FIG. 4 shows a corresponding structure of a low swing charge recycling (LSCR) XOR gate according to an embodiment of the present invention. Moreover, FIG. 5 shows a timing diagram of the conventional structure and FIG. 6 shows a timing diagram of the low swing charge recycling (LSCR) structure according to the embodiment of the present invention.

In the conventional structure, the XOR gate includes a low swing voltage driver 100 and a complementary nMOS pass gate circuit 200 determining logical operations. When CLK=1, the low swing voltage driver 100 is activated and it drives the source of the pass gate circuit 200 by the low swing voltage, $V_{dd}-V_{th}$, In response to the input signal to the pass gate 200 complementary signals OUT and $\overline{OUT}$ are pulled to $V_{dd}-V_{th}$ and ground level, or vice-versa, as can be seen from FIG. 5.

The out and $\overline{OUT}$ signals can be connected to succeeding stages of pass gates. Since the driver 100 is dynamically activated, one node is pulled to $V_{dd}-V_{th}$ and the other node complementary to the one node is left floating at the ground level. When CLK=0, both outputs are discharged to ground. In practical datapath circuits, the pass gate chain can be very long, many wires need to be wired through the datapath, and many signals couples with the long floating node, making protection of the dynamic node from capacitive coupling and/or signaling delay difficult. Capacitive coupling into the dynamic node can degrade speed and/or cause operational failure. Since the conventional low swing structure particularly uses the dynamic low swing driver, the conventional structure is called as Low Swing Dynamic Driver (LSDD) structure.

On the contrary, according to the embodiment of the present invention, the LSCR logic includes a low swing voltage driver 1, a complementary NMOS pass gate circuit 2 for determining the logical operations, and a equalization transistor (equalizer) 3 for performing charge recycling. When CLK=1,the low swing voltage driver 1 is activated and the complementary signals OUT and $\overline{\text{OUT}}$ are pulled to $V_{dd}$-$V_{th}$ and ground level, or vice-versa, in the sane way as the LSDD structure.

Note that, in the LSCR structure, evaluation is static and all nodes are actively driven. Since the driver 1 is static, all the nodes are driven by the supply or the ground during the evaluation, thus there exists no floating nodes. Therefore, in the LSCR structure, the operational failure and/or signaling delay can be rather avoided.

When CLK=0, the tri-state gate driving into nMOS pass gates are shut off and the equalization transistor (FET) 3 is activated, resulting in charge sharing between OUT and $\overline{\text{OUT}}$ nodes. As is shown in FIG. 6, after charge sharing occurs, both nodes are precharged to approximately the intermediate voltage, such as ($V_{dd}$-$V_{th}$)/2, between $V_{dd}$-$V_{th}$ and ground. Furthermore it can be seen that the effective logic signal swing is reduced to a half of that for the conventional LSDD structure, and the power consumption reduction can be achieved. In both LSDD and LSCR structures, the output from the final stage of the XOR gate is latched in a differential sense amplifier latch circuit or flip-flop.

[Operation of Low Swing Charge Recycling CMOS Circuit Arrangement]

As shown in FIG. 4, the low swing driver 1, which limits the swing voltage, is activated by the clocking signal CLK. The signals driven by the driver are connected to the pass gate network 2. The outputs of the driver 1 are connected to the source or drain of transistors and the gate of these transistors are driven by normal swing voltage. There are two branches of the pass gate network 2. One is driven by true signals and the other is driven by compliment signals. The node in one branch always has the corresponding node. One node such as node 4 represents the true signal, the other node such as node 5 represents the compliment signal.

These two nodes 4 and 5 are connected by a transistor switch (equalizing transistor 3). The node 4 is connected to the source of the transistor 3 and the node 5 to the drain of the transistor 3. The gate of the transistor 3 is driven by the clock signal (equalizing signal). This clock signal is the compliment of the clocking signal in the driver gate. In other words, when the driver 1 drives the signals into the pass gate network 2, the equalizing clock turns off, the equalizing signal turns on the equalizing transistor 3 and the charge stored in the nodes 4 and 5 are shared. The voltage of the nodes 4 and 5 becomes the same.

As can be seen from FIG. 6, the circuit operation consists of two phases, an equalization phase and an evaluation phase. During the equalization phase, the voltage of two nodes 4 and 5 are equalized by turning on the equalizing transistor 3. And the low swing driver 1 is disconnected from these nodes by turning off the driver's clocking. When the circuit is evaluated, equalization transistor 3 is turned off and the low swing driver 1 drives the pass gate network 2. One of the two nodes 4 and 5 is pulled up to higher voltage $V_{dd}$-$V_{th}$) and the other is pulled down to ground. The difference of the voltage of these two nodes is detected at the following stage such as the sense amplifier circuit that is usually provided at the following stage.

[Structure of Low Swing Driver]

Figure 7:
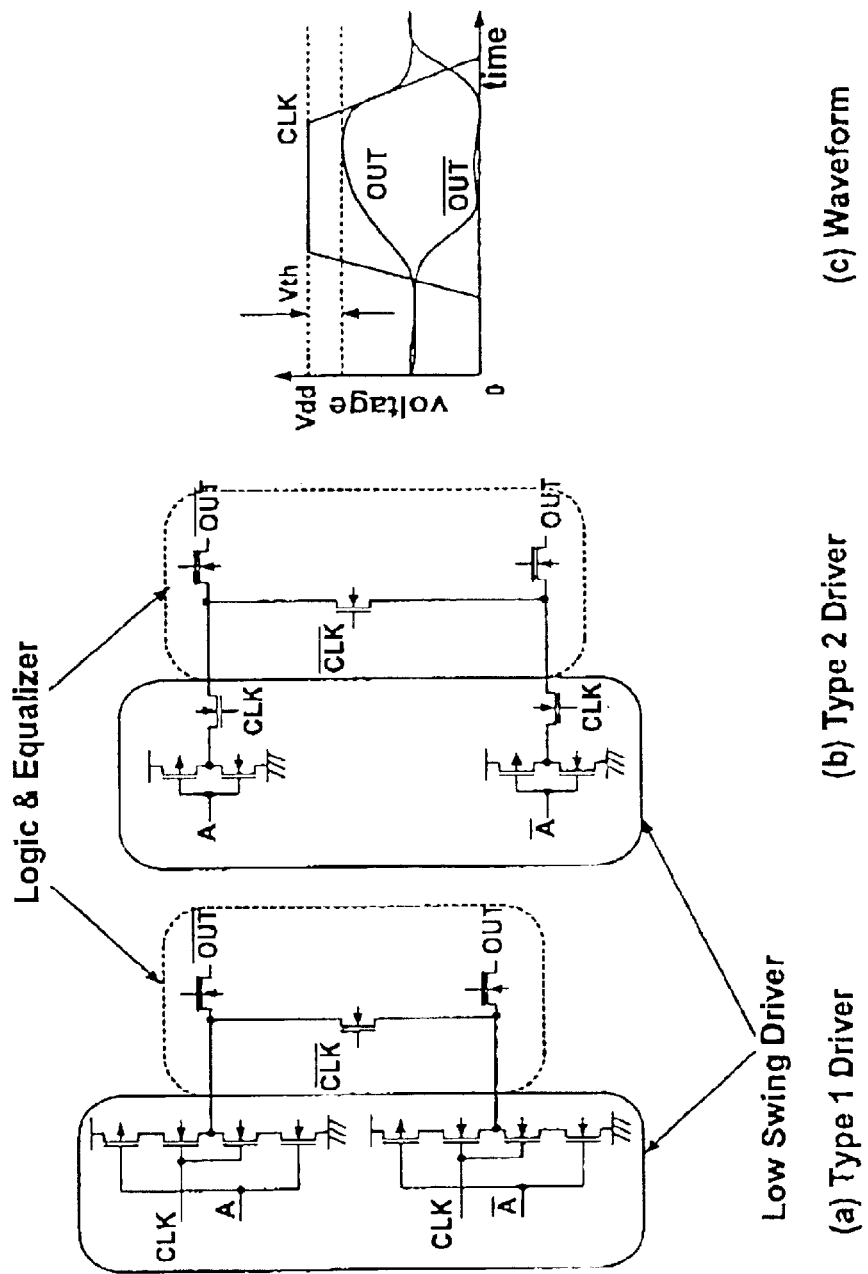
FIG. 7 shows a structure of a low swing driver according of a first embodiment to the present invention.
Figure 8:
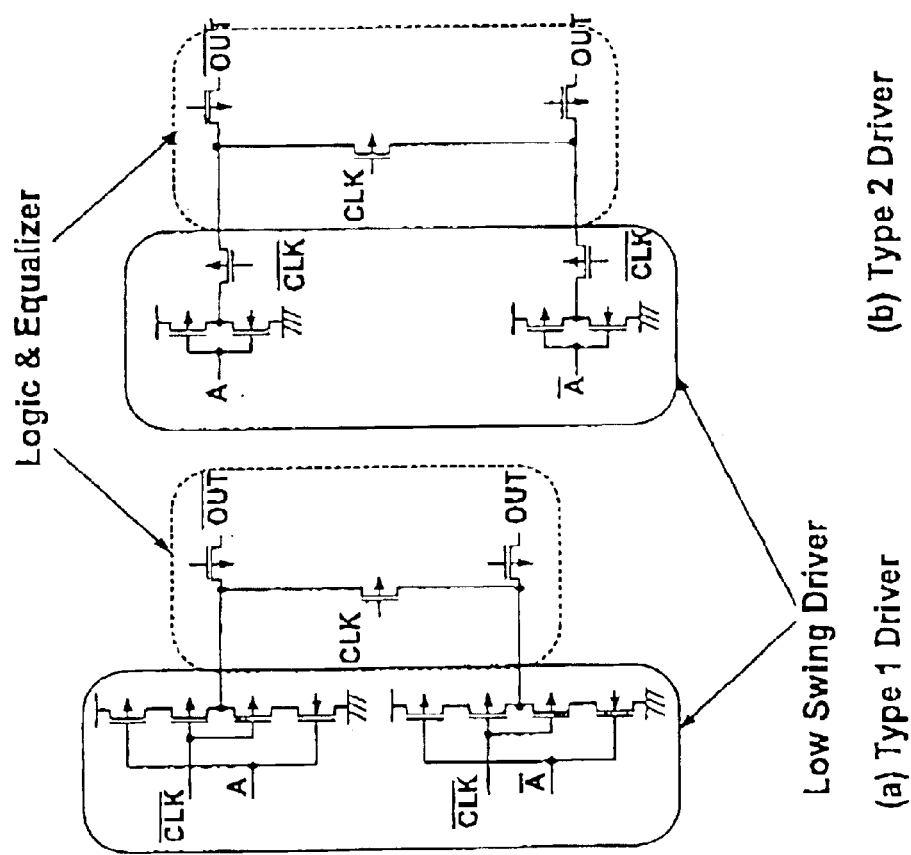
FIG. 8 shows a structure of the low swing driver according of a second embodiment to the present invention.
Figure 9:
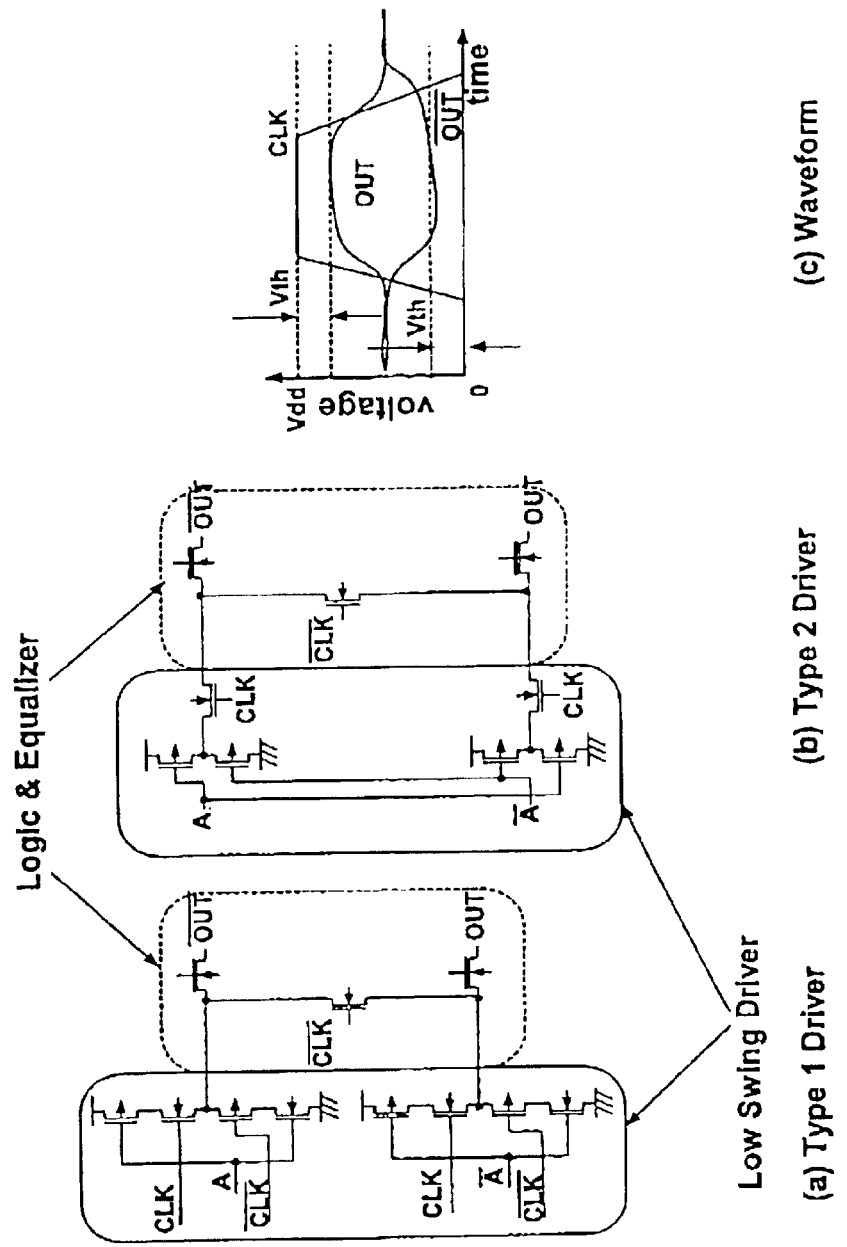
FIG. 9 shows a structure of the low swing driver according of a third embodiment to the present invention.

The low swing drivers according to the present invention can be roughly categorized into three classes, as shown in FIGS. 7, 8, and 9. FIG. 7 shows a structure of a low swing driver according of a first embodiment to the present invention, in which the swing level may change from ground level to $V_{dd}$-$V_{th}$. FIG. 8 shows a structure of the low swing driver according of a second embodiment to the present invention, in which the swing level may change from $V_{th}$ to $V_{dd}$. FIG. 9 shows a structure of the low swing driver according of a third embodiment to the present invention, in which the swing level changes from $V_{th}$ to $V_{dd}$-$V_{th}$. In each of the driver configurations as shown in FIGS. 7 to 9, there are type 1 and type 2 drivers. The type 1 driver comprises a plurality of transistors connected in series. The type 2 driver includes transistor inventors being clipped by pass gates.

Since the type 1 low swing driver of the first structure, as shown in FIG. 7, may be considered the typical one, it is applied to the various embodiments of the present invention.

[1-Bit Adder]

Figure 10:
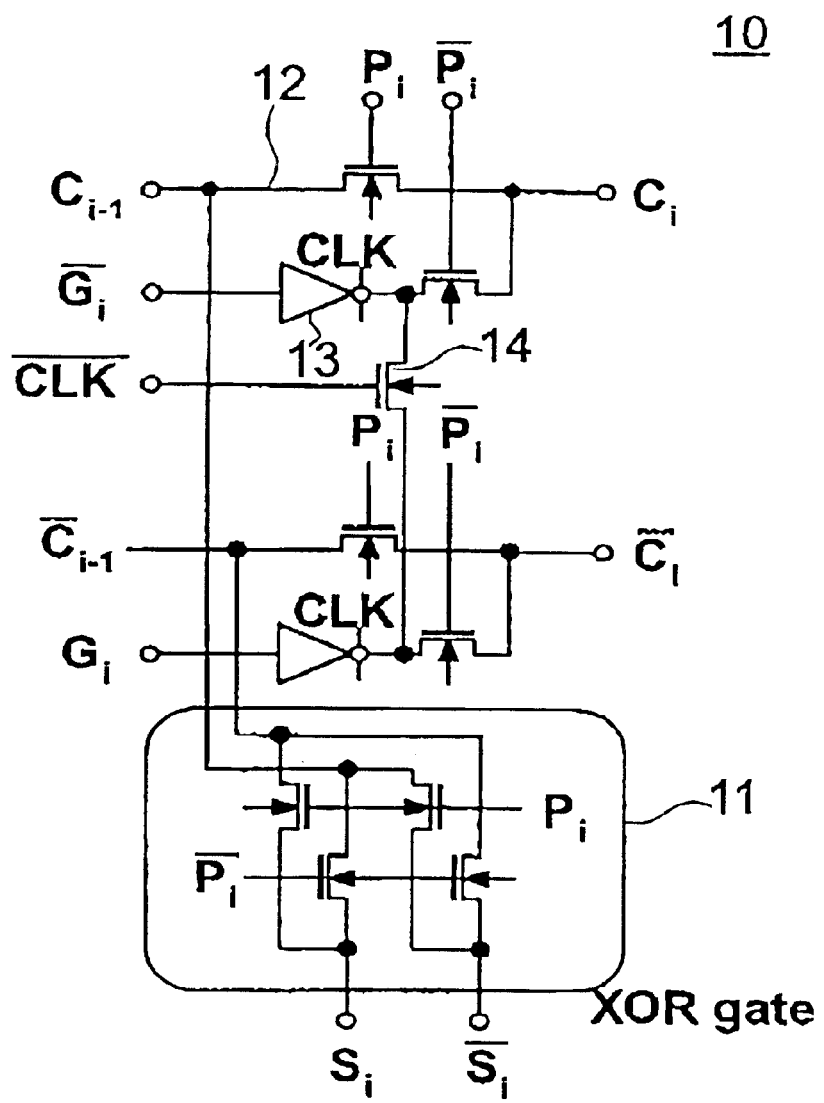
FIG. 10 shows a structure of a 1-bit adder according to an embodiment of the present invention.

Referring to FIG. 10, a 1-bit adder according to another embodiment of the present invention will be explained, in which the inventive low swing charge recycling technique is applied to the 1-bit adder. FIG. 10 shows a structure of the 1-bit adder 10 according to the embodiment. The 1-bit adder 10 comprises a logic pass gate circuit The 1-bit adder 10 receives carry input signals $C_{i-1}$ and $\overline{C_{i-1}}$ that are driven by the low swing driver 1 (not shown in FIG. 10) as well as generate signals $G_i$ and $\overline{G_i}$. When the low swing driver 1 is deactivated, the carry input signals correspond to complementary signals that are charge shared by the equalizer 3 (not shown in FIG. 10). In the 1-bit adder 10, the generate signals $G_i$ and $\overline{G_i}$ are converted to low swing charge sharing internal generate signals by a low swing driver 13 and a equalization circuit 14.

A gate of an nMOS pass gate 11 in the 1-bit adder 10 is controlled by propagate signals $P_i$ and $\overline{P_i}$. Carry output signals $C_i$ and $\overline{C_i}$ may be transferred to a succeeding stage as the carry input signals if the 1-bit adders are connected in series. Sum signals $S_i$ and $\overline{S_i}$ are formed by applying XOR operation to the true carry input signal with the true propagate signal and the compliment carry input signal and the compliment propagate signal.

The generate signal $G_i$ and the propagate signal $P_i$ can be written as:

$$G_i = A_i \text{ AND } B_i$$

$$P_i = A_i \text{ XOR } B_i$$

where both $A_i$ and $B_i$ represent input signals to the 1-bit adder 10. It is noted that the logic swing of the signals $A_i$, $B_i$, $G_i$ and $P_i$ is $V_{dd}$.

[4-Bit Adder Module]

Figure 11:
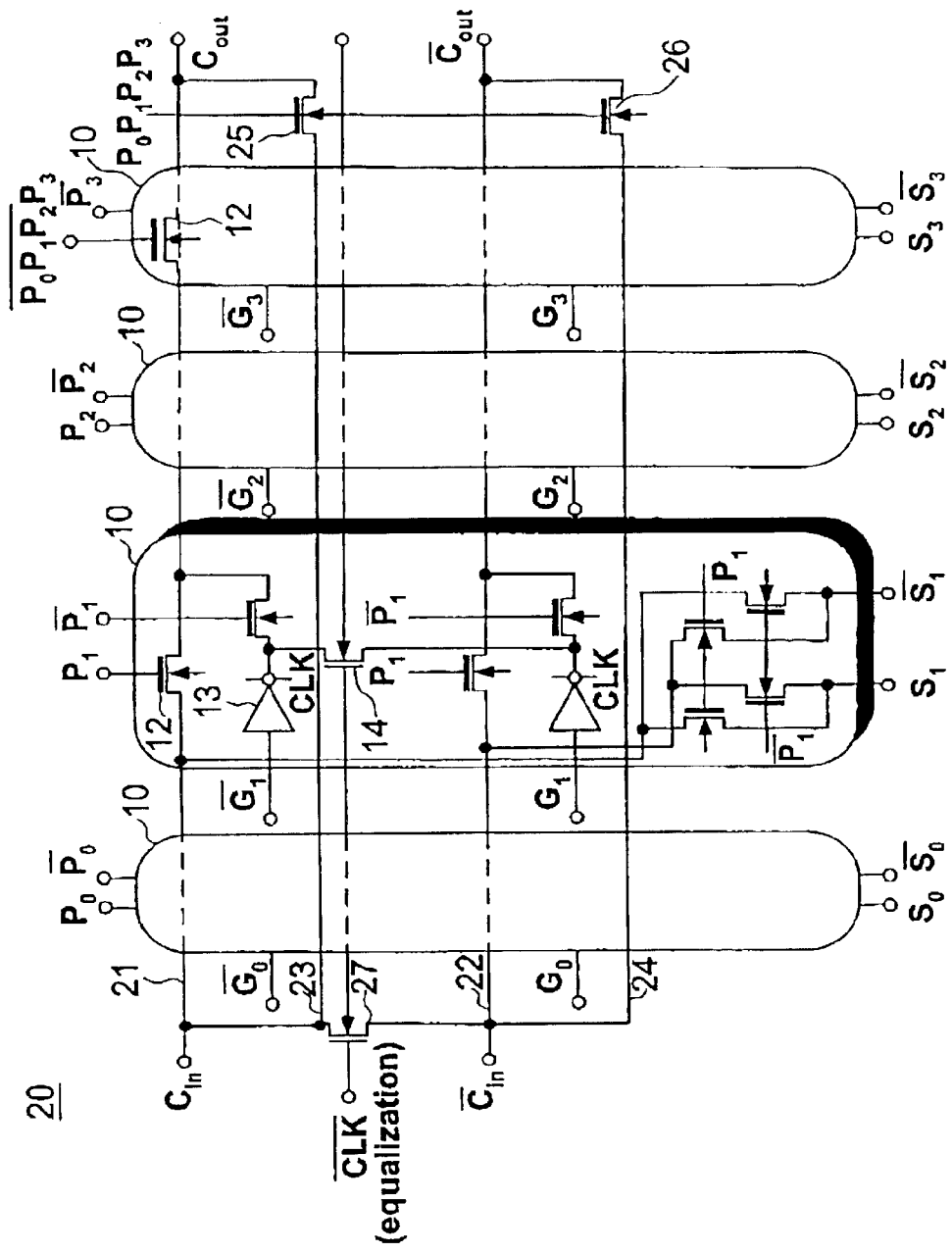
FIG. 11 shows a structure of a 4-bit carry skip adder module according to an embodiment of the present invention.

Referring to FIG. 11, a 4-bit carry skip adder module according to an embodiment of the present invention will be explained. FIG. 11 shows a structure of the 4-bit carry skip adder module implementing LSCR technology. The 4-bit carry skip adder of FIG. 11 can be easily formed by connecting four 1-bit adders 10 of the previous embodiment shown in FIG. 10.

For the purpose of designing carry skip, the 4-bit carry skip adder module 20 includes the four 1-bit adders 10, carry propagating paths 21 and 22 for propagating the carry bits in series and bypass paths 23 and 24. Each of the bypass paths 23 and 24 includes a bypass transistor 25 and 26, respectively, for passing the carry signals directly in order to reduce delay due to the carry propagating paths 21 and 22. In this case, the conflict between the carry signals propagating along the carry propagating paths and the bypass carry signals passing through the by path paths may probably increase the propagation delay. Therefore, in this embodiment, the transistor 12 on the carry propagating path 21 and the transistor 25 on the bypass path 23 are exclusively gated in order to avoid the conflict.

In this embodiment, the carry input signals $C_{in}$ and $\overline{C_{in}}$ are applied to the 4-bit carry skip adder module 20 by means of the low swing driver 1 (not shown in FIG. 11). When the low swing driver 1 is activated, the carry input signals, which are low swing voltage controlled, are applied to the module 20. Otherwise, an equalizer (equalizing transistor) 27 is activated and the charge sharing signals are applied to the module 20 as the carry input signals $C_{in}$ and $\overline{C_{in}}$.

For each bit of the 4-bit adder module 20, generate signals $G_0$ and $\overline{G_0}$, $G_1$ and $\overline{G_1}$, and so on are applied to the 4-bit adder module 20 as the low swing charge recycling signals, for example, by means of a low swing tri-state inverter 13 and an equalizer 14.

Although the carry signals propagating through the 4-bit adder module 20 are low swing signals, the equalizing transistor 27 is not necessarily provided at every low swing node, but is provided at the output of the low swing driver 1. This is because since the pass transistors are gated by the complementary signals, shorting circuit of a source of one of the transistors is sufficient to lead to the low swing at the other transistor.

It is noted that the differential sense amplifier latch at the final stage is not shown in FIG. 11 for clarification of the drawing.

The carry signals propagate through the module 20 and differential voltage between $C_{out}$ and $\overline{C_{out}}$ is amplified and latched in the sense amplifier flip-flop (not shown in FIG. 11). Note that there is no contention between the bypass transistor 25 gated by $P_0P_1P_2P_3$ and the local carry chain. The sum signals are generated by pass gate XORs and are also latched in the sense amplifier flip-flops (not shown in FIG. 11).

[Multi-Bit Adder]

Figure 12:
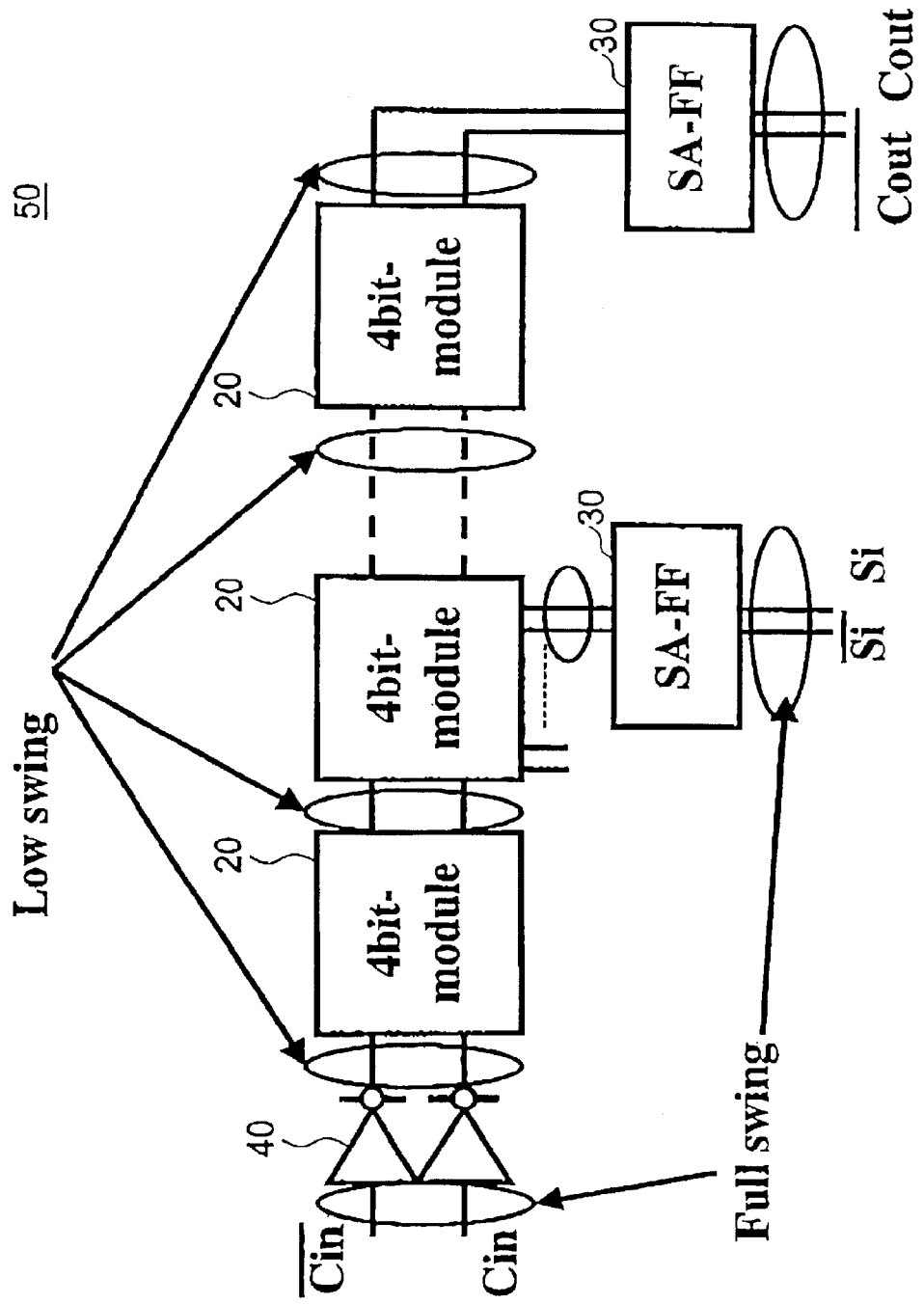
FIG. 12 shows a structure of a multi-bit adder according to an embodiment of the present invention.

A multi-bit adder 50 formed of any number of bits can be designed by serially connecting the above-described 4-bit carry skip adder modules 20. FIG. 12 shows a structure of the multi-bit adder according to an embodiment of the present invention. As shown in FIG. 12, the multi-bit adder 50 includes low sting drivers 40 for receiving full swing complementary carry input signals and generating the low swing complementary carry input signals followed by the 4-bit adder modules 20 connected in series. The respective output of each 4-bit adder module 20 is connected to the differential sense amplifier latch circuit (SA-FF) 30, which generates bit sum signals $S_i$ and $\overline{S_i}$ of the full swing. The carry output signals $C_{out}$ and $\overline{C_{out}}$ are also delivered by means of the differential sense amplifier latch circuit 30.

It is noted that the internal carry signals propagating through each 4-bit adder module 20 are low swing signals.

Figure 13:
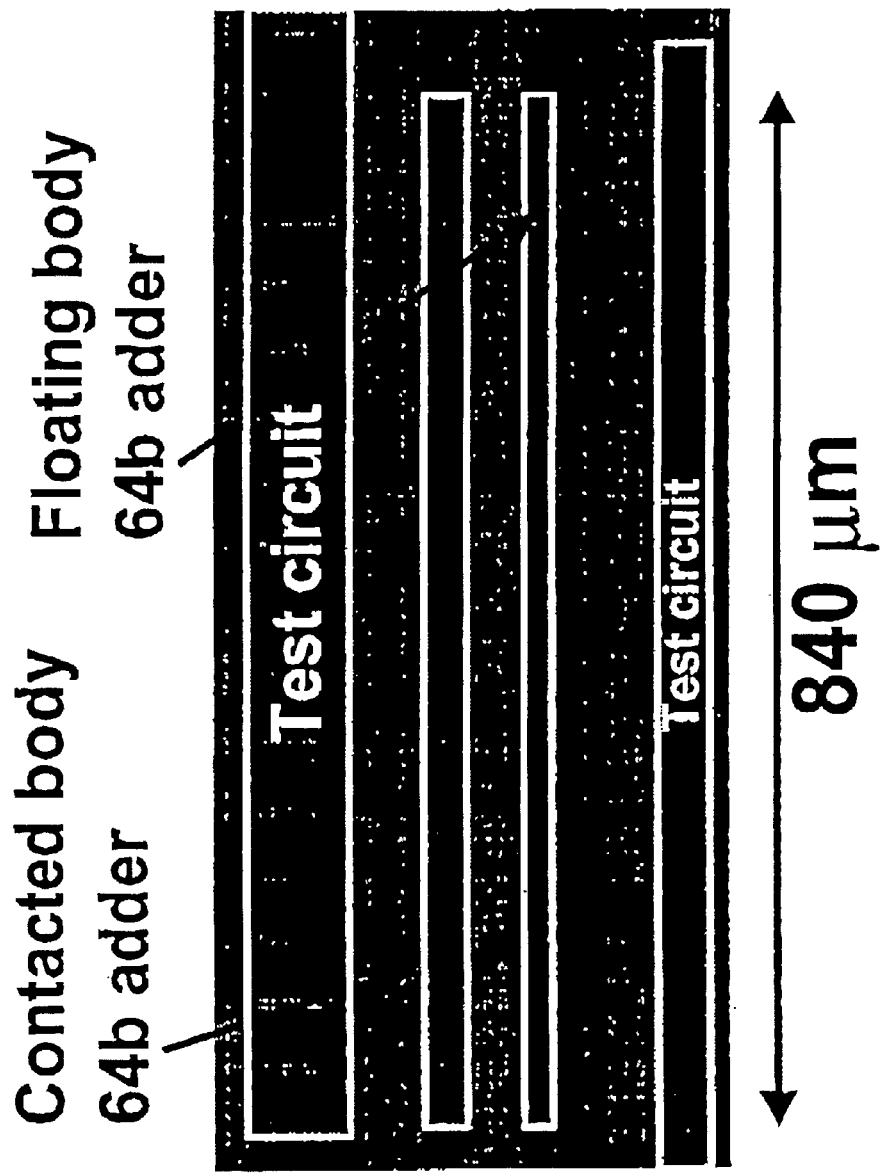
FIG. 13 shows a chip structure of a 64-bit adder according to an embodiment of the present invention.

In designing a wider adder, although it is expected that the carry bypass paths be multiplexed in order to achiever high-speed circuit, an experimental 64-bit adder was designed by serially connecting 16 4-bit adder modules 20 according to a further embodiment of the present invention. The 64-bit adder was fabricated in 0.08 µm SOI CMOS technology. The 64-bit adder may be evaluated as a 32-bit adder depending on the module structure. FIG. 13 shows a photomicrograph of the 64-bit adder. The actual size of the 64-bit adder with the floating body SOI devices is 23 µm by 840 µm.

[Application to SOI Device]

Figure 14:
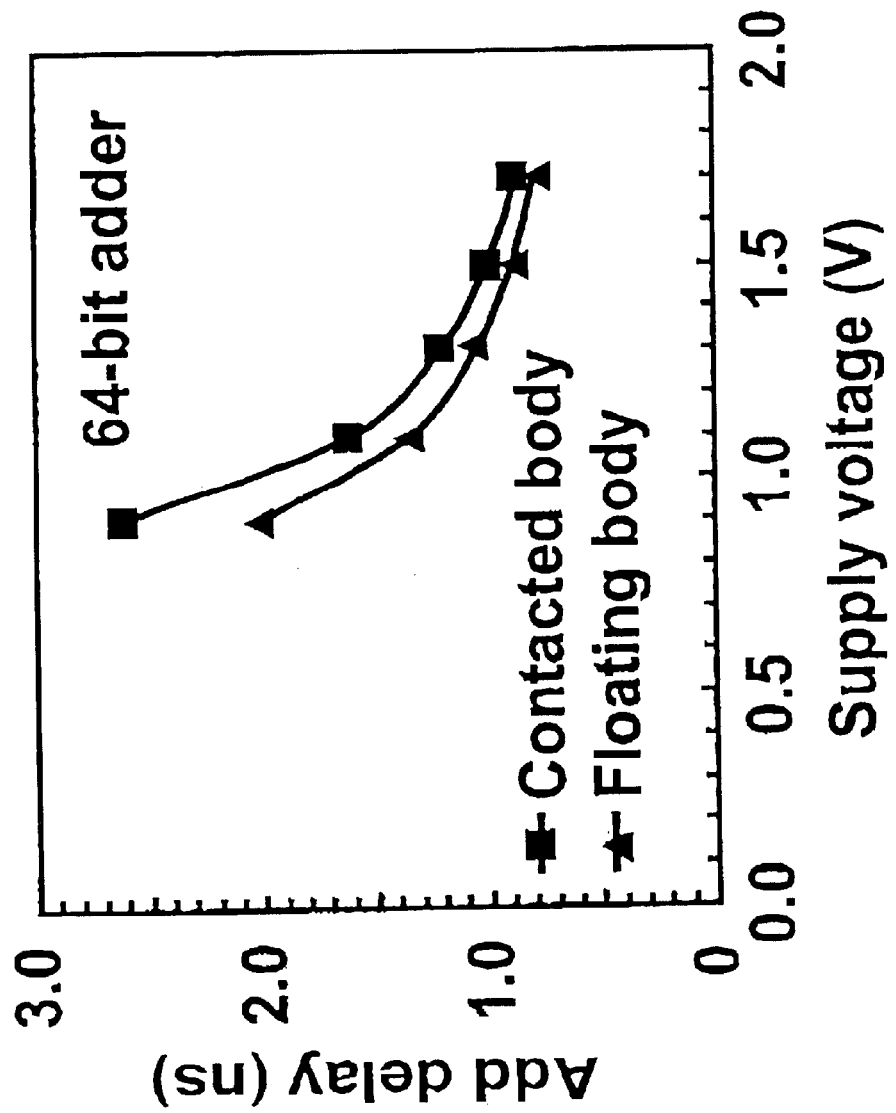
FIG. 14 shows a graph illustrating an add delay of the contacted body and floating body 64-bit adders.

Both LSDD and LSCR structures can be designed using either of bulk CMOS or SOI CMOS. Those bulk CMOS and SOI CMOS heavily use serial pass transistors for performing logical operations. As a result, the bulk CMOS has the well potential being fixed, and has the high threshold voltage due to the body effect, resulting in the increasing delay, In the SOI CMOS, the use of the floating body SOI enables the well potential to be raised due to coupling of the well potential to the source of the device. This allows reducing the body effect and suppressing the increasing delay. FIG. 14 shows a graph illustrating the delay time for the two 64-bit adders using the 0.08 µm SOI CMOS device, in which one adder is designed based on the contacted body and the other based on the floating body. This simulation shows the benefit of the floating body in 0.08 µm SOI. Add delay is plotted vs. $V_{DD}$ for both 64-bit adders.

In the 64-bit adder, the critical path of the 64-bit adder consists of 21 serially connected nMOS transistors. In these simulations, the extra capacitance associated with the body contact was not included in order to show only the benefit of reduced body effect in the floating body devices. The addition times were estimated using an offset voltage of 100 mV, which is the signal required by the flip-flop. The floating body improves the critical path delay from 13% at $V_{DD}=1.3V$ to 24% at $V_{DD}=0.9V$.

In the floating body SOI devices, the body potential significantly changes as it is reflected on the history effect—the change in delay due to previous circuit activity. In particular, if the pass transistor logic operates in the full swing static logic, because both the source and drain voltages range from ground level to supply voltage, the body potential changes by a large amount and the variation in the delay time due to the history effect becomes wider.

According to the low swing charge recycling structure of the present invention, the history effect in SOI devices is minimized, because the nMOS pass transistor network is equalized every clock cycle, and during equalization, source and drain voltages of the pass transistors reset to the similar voltage and the swing of the source and drain voltages of the pass transistors is limited from ground level to $V_{dd}-V_{th}$. The critical path delay was simulated through 4-bit floating body adder module for 100 cycles at 500 MHz, and confirmed that the delay fluctuation is less than 0.2%.

[Reduction of Drive Current Due to Body Effect]

The body effect will be explained in detail. Conventionally, the drive current of the transistor is calculated, assuming that the source voltage (S) and the body voltage (B) are equivalent. That is to say, it is assumed that in the nMOS configuration, the source voltage takes ground level, and in the pMOS configuration, the source voltage takes the supply voltage. This assumption may be true if the device forms a simple inverter.

However, this is not the case, when the device forms a multi-input NAND gate or NOR gate that includes serially connected transistors, or when the serially connected transistors such as pass transistor logic are driven at the source. For example, a source node of one nMOS transistor being arranged nearer the output side of the 2-input NAND gate is connected to the drain terminal of the other transistor. During switching operation, the voltage of this source node becomes higher than ground level. If the body voltage of the one transistor is also connected to ground level, the source voltage becomes higher than the body voltage of the one transistor. Accordingly, in effect, the body voltage is reversely biased with respect to the source voltage toward negative voltage. Furthermore, the gate-source voltage becomes lower than the ordinarily applied voltage. Therefore, the reversely biased body voltage and the lower gate-source voltage cause the drive current of the transistor to be reduced.

[Body Effect in SOI]

In SOI devices, it is difficult to have an access to the body terminal under the conventional SOI's structure. Even if the access to the body terminal can be made, it involves an enlargement of the surface area and an increasing parasitic capacitance. So, the commonly used SOI device is a floating body SOI device, which leaves the body floating. In the floating body SOI device, the body voltage is determined based on several factors such as (1) a leakage current of a PN connection between the source and the body or the drain and the body, (2) minority carrier current (i.e., substrate current) produced to the end of the drain when the current flows through the channel, and (3) coupling effect due to the parasitic capacitance at the body-gate, body-source, and body-drain, respectively.

However, the body voltage is not kept constant, but rather changes depending on the transistor's status. The rate of the variation in the body voltage may be slower or faster depending on a fluctuation factor for the body voltage. If the body voltage changes due to the leakage current, it fluctuates at the rate of microseconds order, on one hand, and if it changes due to the capacitance coupling, it fluctuates at the rate of picoseconds order, on the other. The slow fluctuation of the body voltage at the rate of microseconds results in the variation of the switching property (ex. delay) of each circuit operation Thus, the circuit operation is dependent on the previous circuit operations. In other words, the circuit is influenced by the history effect.

A magnitude of the history effect depends on the swing of the variation of the body voltage. Consequently, since the variation of the body voltage depends on the variation of other terminals of the device, the history effect becomes more significant as the magnitude of the variation of the other terminal's voltage becomes higher. Particularly, since, in the transistor forming a part of the pass gates, both source and drain voltages of the transistor changes from ground level to supply voltage level, the history effect is more significant than that of the serially connected.

[History Effect in SOI Transistor Implemented by Inventive Low Swing Charge Recycling Structure]

According to the various embodiments of the present invention, the following two features can reduce the history effect.

Firstly, the nMOS transistors performing logical operations are formed by the pass gates. Since the source and drain voltages are driven in accordance with the low swing controlled voltage, the magnitude of the variation of the body voltage can be reduced.

Secondarily, the source and drain voltages in the pass gates are reset to approximately the same voltage by each of equalization process before the circuit operation, the variation of the voltages before the circuit operation can be reduced.

[Simulation of Various Adders]

The performance of a 32-bit adder using the low swing charge recycling structure according to the present invention is compared with other adders and with the low swing dynamic differential (LSDD) adder. In this example, the 4-bit carry skip scheme is employed to implement the 32-bit adder. Since the 4-bit adder modules are connected in series in order to realize the multi-bit adder, as the number of bits increases the delay time of the multi-bit adder increases rapidly. If the multi-bit adder is configured to have a bit length more than 32, a carry skip mechanism for a multiple bypass structure has to be added to the multi-bit adder. Therefore, in this example, the 32-bit configuration is employed.

The following 4 types of 32-bit adders (1) to (4) are compared with respect to speed (i.e., delay) and power.

(1) Serially connected carry look ahead (CLA) adder:

This adder includes 8 4-bit CLA adders connected in series. The circuit architecture is designed using the conventional static CMOS. This architecture is equivalent to that of the embodiment of the present invention and uses the conventional fuel swing CMOS.

(2) Multi-level CLA adder:

This adder is the conventional CLA adder including the 4-bit CLA adders in combination with the 8-bit CLA adders. The circuit architecture of this multi-level CLA adder is equivalent to that of the above-described serially connected CLA adder using the full swing CMOS. This architecture is called as the multi-level CLA in order to distinguish it from the is serially connected CLA adder.

(3) LSDD adder:

This adder consists of a 32-bit LSDD adder. This adder includes 8 4-bit carry skip adders connected in series. In this adder, the circuit architecture of this adder is equivalent to that of the embodiment of the present invention, but the signal driving scheme is different from that of the present invention.

(4) LSCR adder:

This adder is a 32-bit low swing charge recycling adder according to the above-described embodiment of the present invention. The 32-bit LSCR adder is formed by 8 4-bit adder modules connected in series.

Figure 15:
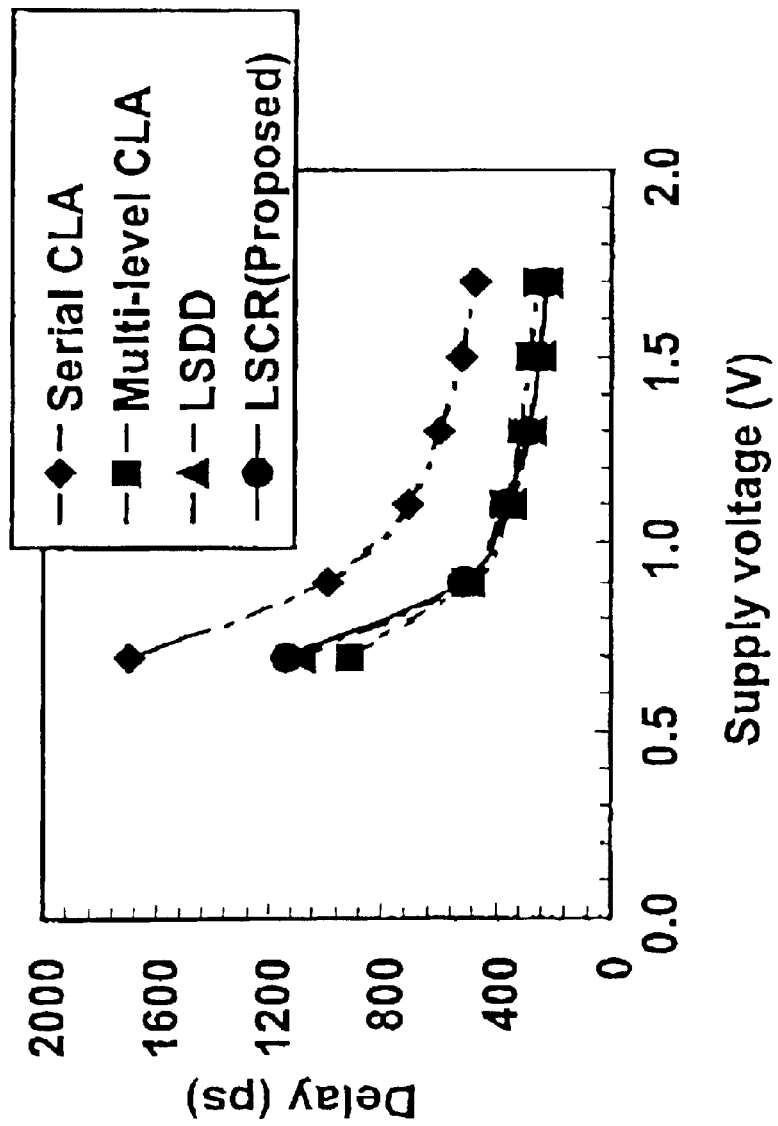
FIG. 15 shows a graph illustrating the add delay of the various adders as a function of the power voltage.
Figure 16:
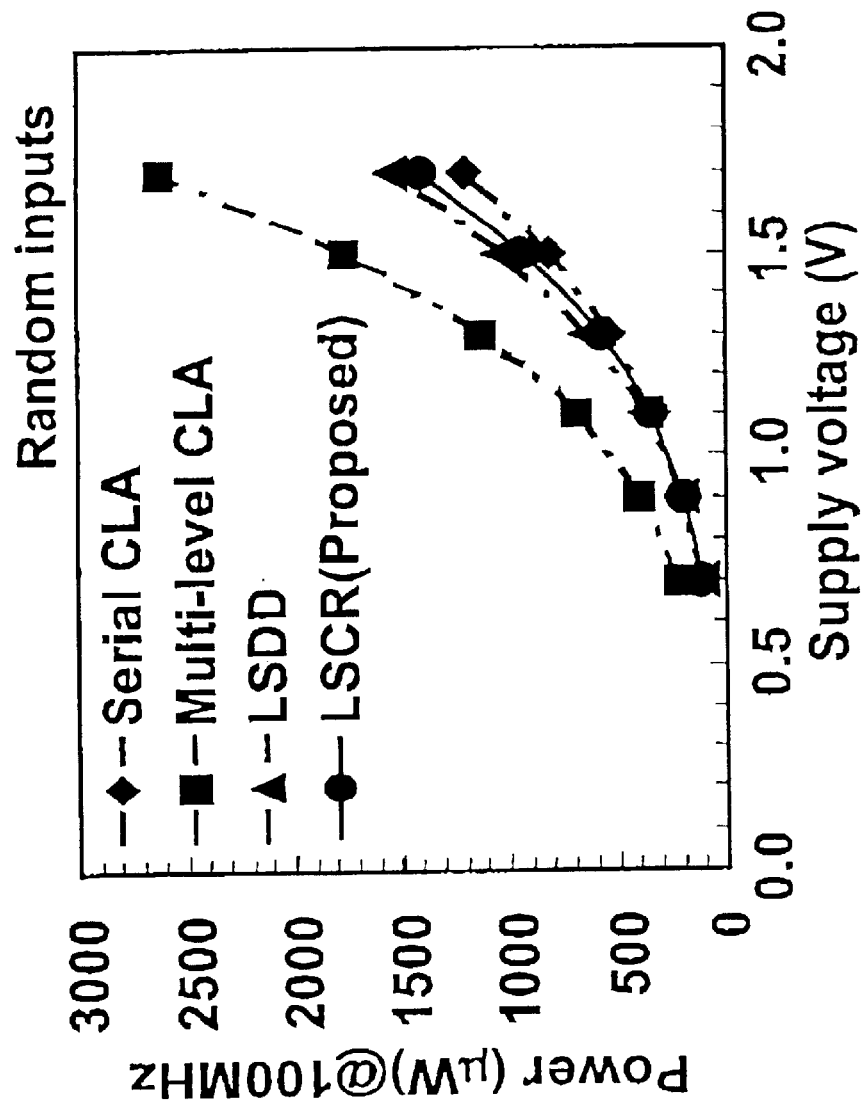
FIG. 16 shows a graph illustrating the power consumption of the various adders as the function of the power voltage.

FIG. 15 shows a graph illustrating the add delay of the various adders as a function of the power voltage and FIG. 16 shows a graph illustrating the power consumption of the various adders as the function of the power voltage. Pseudo-random inputs and a clock frequency of 100 MHz were used to valuate the consumption power. As can be seen from FIGS. 15 and 16, the serially connected CIA adder was the worst adder in terms of the delay time, and other adders rather than the serially connected CLA adder presented approximately the similar performance with respect to the delay time. As to the power consumption, the multi-level CLA adder presented the worst performance and the serially connected CLA adder presented the best performance.

The simulation results for the above-described 4 adders are given in FIGS. 15 and 16. The serially connected CLA adder could reduce the power consumption, but introduced the increasing delay time. In addition, the multi-level CLA adder could reduce the delay time, but consumed the larger power. This indicates that the conventional full swing CMOS adder is not able to reduce both the delay time and the power consumption at the same time. On the contrary, it can be said that the LSDD adder and the LSCR adder, which employs the low swing CMOS, could have achieved not only the shorter delay time but also the lower consumption power. Particularly, the LSCR adder using the charge recycling scheme could have reduced the power consumption lower than that of the multi-level CLA adder by 49%, and lower than that of the LSDD adder by 10%.

Figure 17:
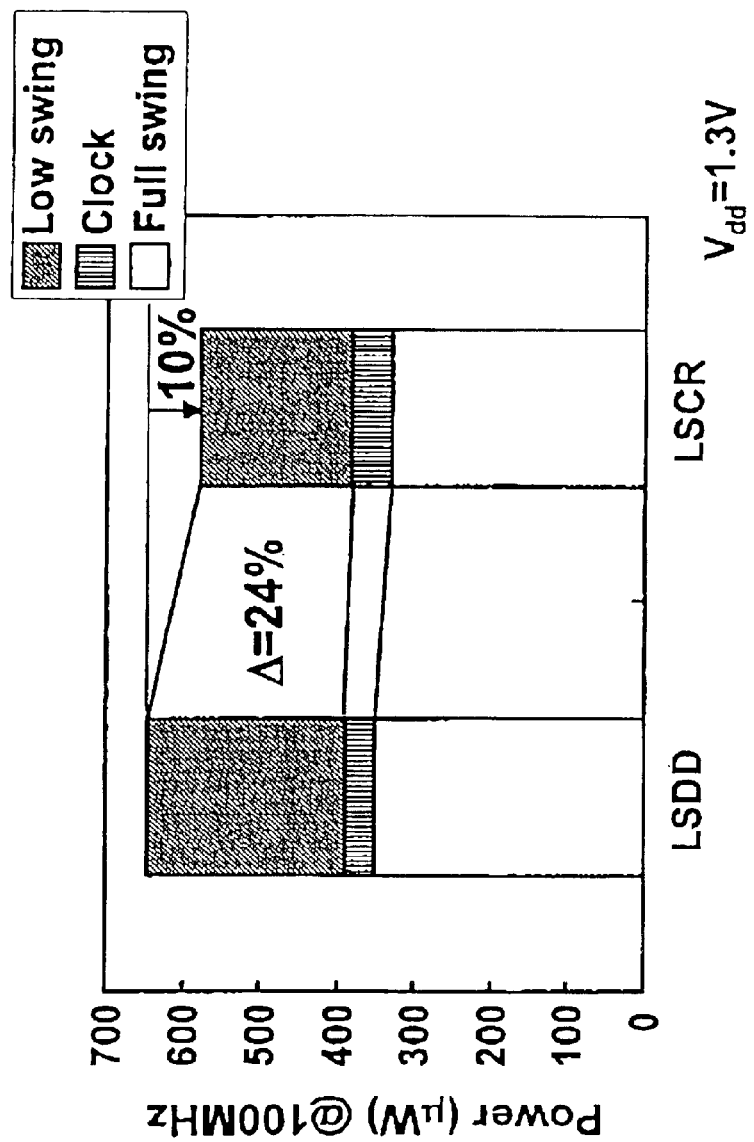
FIG. 17 shows a graph comparing the power consumptions between LSDD and LSCR techniques.

FIG. 17 shows a graph comparing the power consumptions between LSDD and LSCR techniques. The power is consumed in a clock drive portion, as well as a full swing signal portion and a low swing signal portion during the generation of control signals. The use of the charge recycling scheme could achieve the lower power consumption in the low swing signal portion by 24% than that of the LSDD adder. This power consumption has contributed to the reduction of the entire power consumption by 10%. The reason why the reduction of the power consumption in the LSCR adder is less than the theoretical maximum 50% is primarily due to a parasitic component of the added transistors to the LSDD adder in order to design the LSCR adder or the transient leakage current during the clock transition.

The inventive low power consumption circuit arrangement is disclosed, in which the circuit arrangement uses the low swing logic scheme and the charge recycling scheme. The disclosed arrangement can reduce the power consumption without introducing a delay time penalty by lowering not the supply voltage but only the swing voltage. This inventive circuit arrangement was applied to the adder and the performance of the adder was compared with the various adders of the different structure and estimated. It has be found that the conventional full swing CMOS architecture could not suppress both the delay and power consumption at all once, and that the adder involving the low swing logic technology could have achieved the reduction of the delay time and the power consumption at together. Furthermore, it has been found that the adder involving the charge recycling technology could have reduced the entire power consumption lower than that of the conventional low swing logic technology by 10%.

Further, the present invention is not limited to these embodiments, but variations and modifications may be made without departing from the scope of the present invention.

The present application is based on U.S. priority application, which is U.S. provisional patent application No. 60/265,989 filed on Feb. 2, 2001, the entire contents of which are hereby incorporated by reference.

What is claimed is:

1. A circuit arrangement comprising:
a complementary pass transistor logic;
a static driver coupled to the complementary pass transistor logic and configured to drive complementary input nodes to each other of the complementary pass transistor logic by a low swing voltage, the static driver including a PMOS transistor and an NMOS transistor which are coupled in series between at least one of (i) a power supply and an output terminal and (ii) a ground and the output terminal; and
a charge recycling circuit coupled to the complementary pass transistor logic and configured to perform charge sharing between the complementary input nodes when the complementary pass transistor logic is no driven by the static driver.

2. The circuit arrangement as claimed in claim 1, wherein a swing level of the low swing voltage ranges from a ground voltage level to a supply voltage level minus a threshold voltage level.

3. The circuit arrangement as claimed in claim 1, wherein the static driver is formed of a plurality of transistors coupled in series.

4. A low swing charge recycling circuit arrangement comprising:
a complementary pass gate stage having driving inputs to receive each of driving input signals, having complementary outputs to produce an output signal on one hand and a complementary output signal on the other and determining a logic operation of the circuit arrangement;
a static low swing driver stage having a signal input to receive an input signal, having a clock input to receive a clock signal, and having complementary outputs to produce low swing complementary signals to each output to be provided to the driving inputs of the complementary pass gate stage when the clock signal is in one of two states, the static driver stage including a PMOS transistor and an NMOS transistor which are coupled in series between at least one of (i) a power supply and an output terminal and (ii) a ground and the output terminal; and
an equalization stage coupled to the complementary outputs, having a clock input to receive the clock signal and producing complementary signals to the driving inputs of the complementary pass gate stage when the clock signal is in the other state, whereby a charge shared a signal of an intermediate voltage level between those of the complementary outputs is shared between the driving inputs.

5. An adder comprising:
a carry propagating circuit configured to alternatively propagate low swing driven complementary carry input signals and charge sharing complementary carry input signals;
a static low swing driver circuit configured to receive generate signals and to produce low swing driven complementary generate signals, the static driver circuit including a PMOS transistor and an NMOS transistor which are coupled between at least one of (i) a power supply and an output terminal and (ii) a ground and the output terminal;
a pass gate network configured to receive the complementary carry input signals, the complementary generate signals and propagate signals and being controlled by the propagate signals to produce a sum signal by applying XOR operation to the complementary carry input signals with the propagate signals;
an equalization circuit configured to be operative alternatively with the static low swing driver circuit and to provide charge sharing complementary generate signals to the pass gate network; and
a latch circuit coupled to the pass gate network and configured to latch the produced sum signal.

6. An adder module comprising:
at least one adder coupled in series, each adder being provided on the basis of one bit to be added; and
a carry input signal equalization circuit configured to receive carry input signals and to provide charge sharing complementary carry input signals to one end of the adders coupled in series,
wherein the adder comprises:
a carry propagating circuit configured to alternatively propagate low swing driven complementary carry input signals and the charge sharing complementary carry input signals;
a static low swing driver circuit configured to receive generate signals and to produce low swing driven complementary generate signals, the static driver circuit including a PMOS transistor and an NMOS transistor which are coupled between at least one of (i) a power supply and an output terminal and (ii) a ground and the output terminal;
a pass gate network configured to receive the complementary carry input signals, the complementary generate signals and propagate signals and being controlled by the propagate signals to produce a sum signal by applying XOR operation to the complementary carry signals with the propagate signals;

an equalization circuit configured to be operative alternatively with the static low swing driver circuit and to provide charge sharing complementary generate signals to the pass gate network; and a latch circuit coupled to the pass gate network and configured to latch the produced sum signal.

7. The adder module as claimed in claim 6 further comprising:

a carry propagating path configured to propagate the complementary carry input signals in series of bits;

a carry skip path configured to bypass the adders coupled in series in order to pass the complementary carry input signals transparently; and a carry conflict-free circuit configured to protect a conflict of the propagated carry input signals and the passed carry input signals.

8. A circuit arrangement comprising:

a complementary pass transistor logic;

a static driver coupled to the complementary pass transistor logic and configured to drive complementary input nodes to each other of the complementary pass transistor logic by a low swing voltage, wherein the static driver comprises a PMOS transistor and an NMOS transistor, a voltage swing level of the static driver changes in at least one of (i) from ground level to $V_{dd}$-$V_{th}$ and (ii) from $V_{th}$ to $V_{dd}$, $V_{dd}$ denoting a supply voltage and $V_{th}$ denoting a threshold voltage of the NMOS transistor; and a charge recycling circuit coupled to the complementary pass transistor logic and configured to perform charge sharing between the complementary input nodes when the complementary pass transistor logic is not driven by the static driver.

* * * * *